(12) United States Patent
Ganor et al.

(10) Patent No.: US 7,439,652 B2
(45) Date of Patent: Oct. 21, 2008

(54) MULTIDIRECTIONAL PIEZOELECTRIC MOTOR CONFIGURATION

(75) Inventors: Ze'ev Ganor, Herzelia (IL); Moshe De Levy, Haifa (IL); Nir Karasikov, Haifa (IL)

(73) Assignee: Nanomotion Ltd., Yokneam, Ilit (IL)

( * ) Notice: Subject to any disclaimer, the term of this patent is extended or adjusted under 35 U.S.C. 154(b) by 231 days.

(21) Appl. No.: 10/598,311

(22) PCT Filed: Feb. 25, 2004

(86) PCT No.: PCT/IL2004/000188

§ 371 (c)(1),
(2), (4) Date: Aug. 24, 2006

(87) PCT Pub. No.: WO2005/081331

PCT Pub. Date: Sep. 1, 2005

(65) Prior Publication Data

US 2007/0138910 A1    Jun. 21, 2007

(51) Int. Cl.
*H01L 41/08*    (2006.01)

(52) U.S. Cl. .................................. 310/323.02

(58) Field of Classification Search ............ 310/323.02, 310/323.03
See application file for complete search history.

(56) References Cited

U.S. PATENT DOCUMENTS

| 4,983,875 | A | * | 1/1991 | Masaki et al. | 310/323.03 |
| 5,696,421 | A | * | 12/1997 | Zumeris et al. | 310/328 |
| 5,760,528 | A | * | 6/1998 | Tomikawa | 310/323.02 |
| 6,064,140 | A | * | 5/2000 | Zumeris | 310/323.02 |
| 6,949,868 | B2 | * | 9/2005 | Iseki | 310/323.02 |
| 7,109,639 | B2 | * | 9/2006 | Yamamoto et al. | 310/323.16 |
| 7,173,363 | B2 | * | 2/2007 | Hendriks et al. | 310/328 |

FOREIGN PATENT DOCUMENTS

EP    0938144    8/1999

* cited by examiner

*Primary Examiner*—Mark Budd
(74) *Attorney, Agent, or Firm*—EMPK & Shiloh, LLP

(57) ABSTRACT

A method of moving a body (23) comprising: coupling a plurality of piezoelectric motors (31, 32) to the body by pressing a coupling region (48) of each of the motors to a surface of the body; controlling at least one of the motors to apply a force parallel (53) to the surface to move the body; and simultaneously controlling at least one of the motors so that its coupling region executes only vibrations that are substantially perpendicular (51) to the surface.

29 Claims, 6 Drawing Sheets

MULTIDIRECTIONAL PIEZOELECTRIC MOTOR CONFIGURATION

RELATED APPLICATIONS

The present application is a U.S. National Phase of PCT Application No. PCT/IL2004/000188, filed on Feb. 25, 2004.

FIELD OF THE INVENTION

The invention relates to providing motion to a moveable element and in particular to providing motion of a moveable element along more than one direction using piezoelectric motors.

BACKGROUND OF THE INVENTION

Most piezoelectric motors generally impart motion to moveable elements to which they are coupled back and forth along a single straight line, hereinafter referred to as an "axis of motion". To impart motion to a moveable element selectively along more than one axis of motion, generally a relatively complicated transmission system is used to couple a different piezoelectric motor to the moveable element for each different axis of motion desired.

For example, to provide an xy-position stage capable of positioning an element mounted to the stage at any xy-coordinate in a range of xy-coordinates along an x-axis and y-axis, the stage generally comprises an x-stage mounted to a y-stage. The x-stage is coupled to a motor controllable to move the stage along the x-axis and position the stage at a given desired x-coordinate and the y-stage is coupled to a motor controllable to move the y-stage along the y-axis. To position the element at given xy-coordinate the x and y-motors are controlled to move the x and y-stages respectively along the x-axis and y-axis and position the element at the desired xy-coordinate.

SUMMARY OF THE INVENTION

An aspect of some embodiments of the present invention relates to providing an improved method of coupling piezoelectric motors to a moveable body so that the motors are controllable to selectively move the body along different axes of motion.

An aspect of some embodiments of the present invention relates to transmitting motion via a plurality of piezoelectric motors coupled to a same moveable body so that each motor selectively transmits motion to the body independently of the other motors.

In accordance with an embodiment of the invention a plurality of piezoelectric motors are coupled to a moveable body, using methods and devices known in the art, by pressing a region, hereinafter a "coupling region", of each motor to a surface region, hereinafter a "contact surface" of the moveable body. Each motor is controllable to excite vibrations in its coupling region that are selectively substantially perpendicular to and/or substantially parallel to the contact surface of the moveable body. When a given motor is not excited to vibrate, its coupling region presses continuously against the moveable body's contact surface and frictional forces between the body's contact surface and the motor's coupling region are relatively large. Optionally, the coupling region of a piezoelectric motor is a wear resistant "friction nub" mounted to a surface of the motor using methods and materials known in the art and for convenience of presentation, hereinafter, a coupling region of a piezoelectric motors is assumed to be a friction nub.

To control the motors so that a given at least one of the plurality of motors transmits motion to the moveable body, the at least one motor is controlled so that motion of its friction nub applies a force substantially parallel to the body's contact surface. In accordance with an embodiment of the invention, the other motors are controlled to generate vibrations in their respective friction nubs that are substantially perpendicular to the contact surface. Hereinafter, a motor operated to transmit motion to a moveable body in accordance with an embodiment of the invention is referred to as an "operative" motor and a motor controlled to execute substantially only perpendicular vibrations is referred to as a non-operative motor.

Generally, an operative motor is controlled to simultaneously generate in its friction nub both vibrations that are substantially perpendicular to the contact surface and vibrations that are substantially parallel to the contact surface. Usually the amplitudes, frequencies and relative phases of the perpendicular and parallel vibrations are such as to generate elliptical or circular vibrations in the friction nub. Perpendicular vibrations in the friction nub of the operative motor repeatedly separate the motor's friction nub and the moveable body's contact surface and bring them back into frictional contact. During the contact period of each perpendicular vibration cycle, the operative motor is coupled to the moveable body and motion of the motor's friction nub due to the parallel vibrations transmits motion to the body. Depending on the-phase relationship between the perpendicular and parallel vibrations, during a contact period the friction nub transmits motion to the body in one or the other of the directions parallel to the parallel vibrations.

In some embodiments of the invention an operative motor is controlled to operate in a pulsed mode to apply a force parallel to the contact surface of the moveable body. In a pulsed mode a non-symmetrical voltage pulse is applied to an electrode comprised in the piezoelectric motor to transmit motion to the body. Pulsed modes of operation of a piezoelectric motor are described in U.S. Pat. No. 5,453,653, the disclosure of which is incorporated herein by reference.

In some embodiments of the invention, the operative motor is controlled to operate in a DC mode in which the motor is controlled to generate a bending motion that applies a force substantially only parallel to the contact surface of the moveable body. In the DC mode a controller electrifies at least one electrode comprised in the motor with a DC voltage to cause the bending motion and displace the moveable body from a first position to a second position. The DC voltage is maintained on the at least one electrode as long as it is desired to maintain the body at the second position. DC modes of operation are described in U.S. patent application Ser. No. 10/206, 717, the disclosure of which is incorporated herein by reference.

For simplicity of presentation it is assumed hereinafter that an operative motor operates in a mode in which perpendicular and parallel vibrations are simultaneously generated in the motor's friction nub.

The perpendicular vibrations in the friction nubs of the non-operative motors result in their respective friction nubs being separate from the body for a relatively short period of time during each perpendicular vibration cycle. Optionally, the amplitude of the perpendicular vibrations of the non-operative motors is controlled to control and minimize a length of time that the non-operative motors contact the body during each perpendicular vibration cycle. As a result, frictional forces between the friction nubs of the non-operative motors and the moveable body that oppose body's motion are substantially reduced and the given at least one operative motor transmits motion to the body with minimized interference from the non-operative motors.

In some embodiments of the invention, the perpendicular vibrations in the non-operative motors and the operative motor are synchronized so that when the friction nub of the operative motor contacts the contact surface of the body, the friction nubs of the non-operative motors do not contact the body. For such embodiments, the operative motor transmits motion to the moveable body substantially as if the other non-operative motors were not coupled to the body.

In some embodiments of the invention, an operative motor generates a force on the moveable body that has a line of action displaced from the center of mass of the moveable body and generates a torque that tends to rotate the body about its center of mass. In some embodiments of the invention at least two of the plurality of motors are operative motors and are controlled to generate a torque to rotate the body about a desired axis of rotation.

In some embodiments of the invention one motor, an "anchor motor", of the plurality of motors is controlled so that its friction nub is in constant contact at an "anchor region" of the contact surface of moveable body. At least one of the plurality of motors is an operative motor and the other motors are controlled to be non-operative (i.e. so that their friction nubs execute substantially only perpendicular vibrations). The at least one operative motor generates a torque about the anchor region that rotates the moveable body about the anchor region.

There is therefore provided a method of moving a body comprising: coupling a plurality of piezoelectric motors to the body by pressing a coupling region of each of the motors to a surface of the body; controlling at least one of the motors to apply a force parallel to the surface to move the body; and simultaneously controlling at least one of the motors so that its coupling region executes only vibrations that are substantially perpendicular to the surface.

Optionally, controlling a motor to apply a force parallel to the surface comprises controlling the motor so that the coupling region of the motor vibrates with a component of vibration parallel to the surface. Optionally, the method comprises controlling the motor so that the coupling region simultaneously vibrates with a component of vibration perpendicular to the surface of the body.

In some embodiments of the invention, each motor comprises electrodes that are electrified to control its operation.

In some embodiments of the invention, controlling the motor to apply a force parallel to the surface comprises electrifying at least one of the electrodes with a pulsed voltage.

Additionally or alternatively, controlling the motor to apply a force parallel to the surface comprises electrifying at least one of the electrodes with a DC voltage.

In some embodiments of the invention, the method comprises mounting the moveable body to a support structure that constrains it to be selectably moveable along either of a first direction and a second direction. Optionally, coupling the plurality of motors comprises coupling at least some of the motors so that they are controllable to apply force to the surface along the first direction and some of the motors so that they are controllable to apply force to the body along the second direction.

In some embodiments of the invention, the method comprises mounting the body to a support structure that enables the body to be freely moved along any direction parallel to a same plane. Optionally, coupling the plurality of motors comprises coupling a first pair of motors controllable to apply force to the surface along a first direction parallel to the plane and a second pair of motors controllable to apply force to the surface along a second direction parallel to the plane. Optionally, the method comprises controlling the first or second pair of motors to apply forces to the surface that move the body in the first or second direction respectively and controlling the motors so that a net torque resulting from the forces is substantially equal to zero. Optionally, the method comprises controlling a first one of the motors so that its contact region is in constant contact with a particular region of the surface of the body so that the at least one motor that applies a force parallel to the surface generates a torque that rotates the body about the particular region. Additionally or alternatively, the method comprises controlling the motors in a pair of motors to generate a torque that rotates the body about a point along a line that passes through the contact regions of the two motors.

In some embodiments of the invention, at a first position of the body the plurality of motors comprises at least one motor not comprised in the plurality of motors at a second position of the body. Optionally, the method comprises controlling at the first position at least one motor not comprised in the plurality of motors at the second position to apply a force parallel to the surface.

There is further provided in accordance with an embodiment of the present invention apparatus for moving a body comprising: a plurality of piezoelectric motors; and a controller that controls at least one of the motors to apply a force parallel to the surface to move the body and simultaneously controls at least one of the motors to execute only vibrations that are substantially perpendicular to the surface.

Optionally, the surface of the body is planar. Optionally the apparatus comprises: a first support structure coupled to the body that enables the body to move freely only along a first direction parallel to the planar surface; and a second support structure coupled to the first structure that allows the first structure to move freely only along a second direction parallel to the planar surface; wherein at least one of the motors is controllable to apply a force parallel to the surface along the first direction and at least one of the motors is controllable to apply a force parallel to the surface along the second direction. Optionally, the apparatus comprises a plurality of bearings on which the flat surface lies that enables the surface to move freely in any direction parallel to the surface.

Optionally, the plurality of motors comprises at least one set of four motors comprising a first pair of motor controllable to apply force to the surface along a first direction and a second pair of motors controllable to apply force to the surface along a second direction. Optionally, to move the body along the first or second direction the controller controls the first or second pair of motors respectively so that a net torque resulting from the forces the motors apply to the surface is substantially equal to zero. The controller optionally controls at least one motor so that its contact region constantly contacts a particular region of the surface and wherein the force applied by the at least one motor parallel to the surface rotates the surface about the particular region.

In some embodiments of the invention, the controller controls the first pair of motors or the second pair of motors to generate a torque that tends to rotate the surface about a point along a line that passes through the coupling regions of the motors.

In some embodiments of the invention, the surface is a circularly cylindrical surface having an axis of rotation. Optionally, at least one motor is controllable to apply a force parallel to the surface that tends to rotate the cylindrical surface about its axis of rotation and at least one motor is controllable to apply a force parallel to the surface that tends to translate the surface along its axis of rotation.

Optionally, the surface is a spherical surface having a center. Optionally, at least one motor is controllable to apply a force parallel to the surface that tends to rotate the surface about a first axis that passes through the center and at least one motor is controllable to apply a force parallel to the surface that tends to rotate the surface about a second axis that passes through the center.

In some embodiments of the invention, at a first position of the body the plurality of motors comprises at least one motor not comprised in the plurality of motors at a second position of the body. Optionally, at the first position the controller controls at least one motor not comprised in the plurality of motors at the second position to apply a force parallel to the surface.

BRIEF DESCRIPTION OF FIGURES

Non-limiting examples of embodiments of the present invention are described below with reference to figures attached hereto, which are listed following this paragraph. In the figures, identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION OF EXEMPLARY EMBODIMENTS

Figure 1:
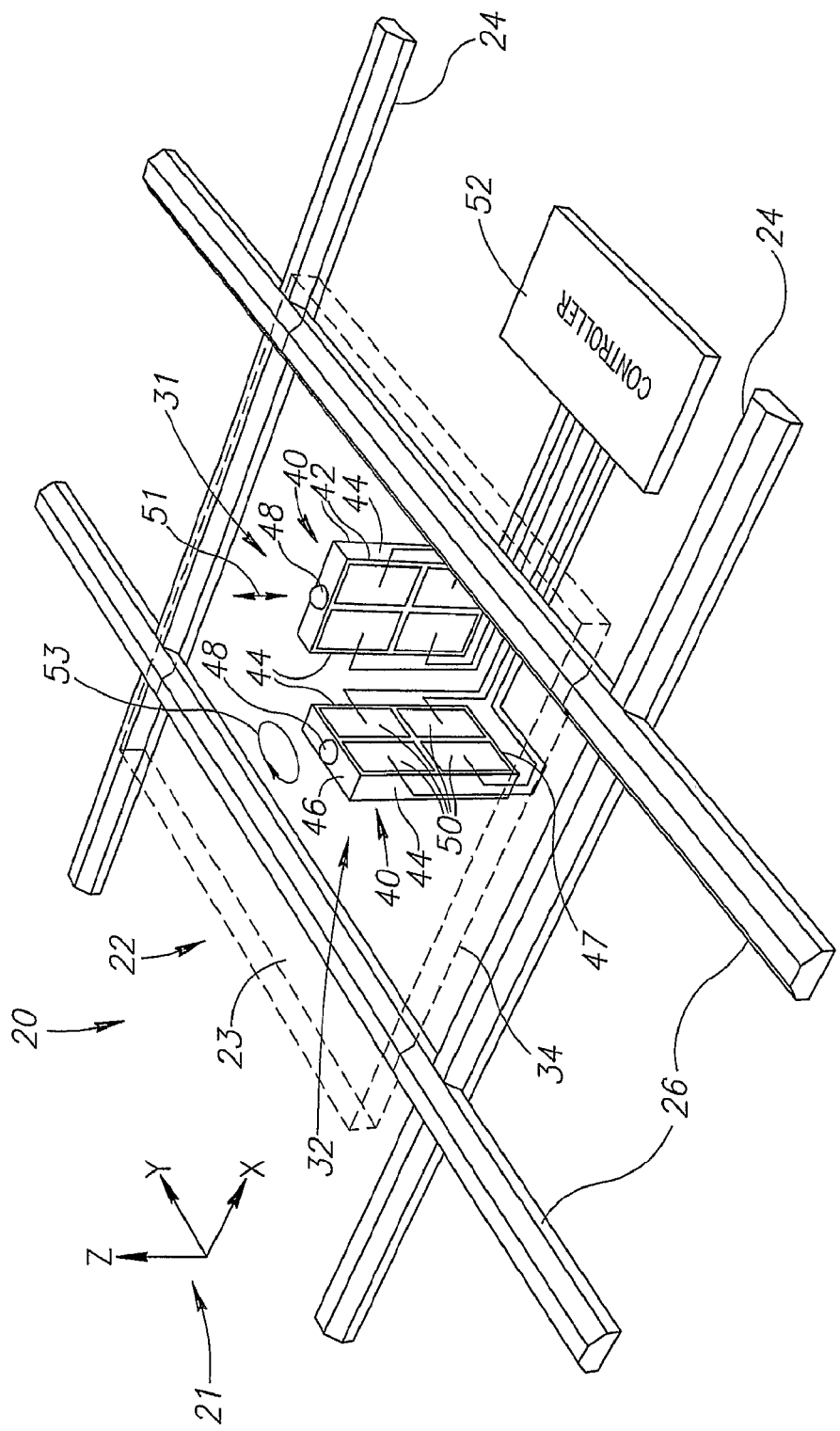
FIG. 1 schematically shows a method of coupling a plurality of piezoelectric motors to a moveable body and illustrates operating the motors to provide linear motion to the body along each of two selectable axes, in accordance with an embodiment of the present invention.

FIG. 1 schematically shows a configuration 20 for coupling a plurality of piezoelectric motors to a moveable body and illustrates operating the motors to provide linear motion to the body along each of two selectable axes, in accordance with an embodiment of the present invention. Directions and locations of features relevant to the discussion are referenced with respect to a coordinate system 21.

By way of example, the moveable body is a plate 22, hereinafter a "motion plate" mounted to a pair of x-sliders 24, which in turn are mounted to a pair of y-sliders 26. Motion plate 22 is mounted to x-sliders 24 using any of various methods and devices known in the art so that the plate is supported by the sliders and may be relatively easily moved back and forth along the x-direction relative to the sliders. X-sliders 24 are mounted to y-sliders 26 using any of various methods readily available in the art so that the x-sliders may be relatively easily moved back and forth along the y-direction relative to the y-sliders. Motion plate 22 is shown in ghost lines to indicate that elements located below motion plate 22, which would normally be hidden from view in the perspective of FIG. 1, are seen through the plate.

The plurality of piezoelectric motors optionally comprises two motors, 31 and 32, which are coupled to a bottom surface 34 of motion plate 22. In accordance with an embodiment of the invention, motors 31 and 32 are "x" and "y" motors respectively, which are operated, as described below, to move motion plate 22 along the x and y-axes respectively.

In accordance with an embodiment of the invention, substantially any piezoelectric motor having a coupling region (e.g. a friction nub) that can be controlled to selectively execute perpendicular and/or parallel vibrations may be used in the practice of the invention. However, for convenience of exposition, x-motor 31 and y-motor 32 are assumed to be similar to motors described in European Publication EP 0 755 054, the disclosure of which is incorporated herein by reference, or in U.S. Pat. No. 5,453,653 referenced above.

Each motor 31 and 32 optionally comprises a thin rectangular plate 40 formed from an appropriate piezoelectric material having two relatively large planar face surfaces 42. Piezoelectric plate 40 has long side edge surfaces 44 and short top and bottom edge surfaces 46 and 47 respectively. Optionally, a friction nub 48 is located on top edge surface 46. Friction nub 48 is preferably formed from a wear resistant material such as alumina. A suitable elastic element (not shown), such as a coil, leaf spring or body formed from an elastic material, presses on bottom edge surface 47 of each motor 31 and 32 to resiliently urge the motor's friction nub 48 against a bottom, contact surface 23 of motion plate 22 to couple the motor to the bottom surface.

Optionally, one of face surfaces 42 of each motor 31 and 32 has four "quadrant electrodes" 50 each covering substantially all the area of a different quadrant of the face surface. The other face surface 42 of each motor optionally has a relatively large electrode (not shown) that covers substantially the entire area of the face surface. A controller 52 is coupled to quadrant electrodes 50 of each motor 31 and 32 and electrifies the quadrant electrodes relative to the large electrode to excite vibrations in piezoelectric plate 40 and thereby in friction nub 48.

Controller 52 electrifies the electrodes in appropriate configurations to excite vibrations in friction nub 48 that are selectively perpendicular to and/or parallel to bottom surface 23 of motion plate 22 using any of various methods known in the art. It is noted that the perpendicular and parallel vibrations, when referenced to piezoelectric plate 40 are conventionally referred to as longitudinal and transverse vibrations. The longitudinal vibrations are parallel to the long dimension of the piezoelectric plate and transverse vibrations are parallel to the short dimension of the large face of the piezoelectric plate.

For example, to excite perpendicular vibrations in friction nub 48, controller 52 optionally electrifies all quadrant electrodes 50 with a same AC voltage relative to the large electrode. To excite both perpendicular and parallel vibrations, and thereby elliptical vibrations, in friction nub 48, optionally controller 52 electrifies quadrant electrodes 50 along a same diagonal with a same AC voltage and quadrant electrodes along different diagonals with AC voltage 180° out of phase. Alternatively, quadrant electrodes 50 along a same first long edge surface 44 may be electrified with a same AC voltage and quadrant electrodes 50 along a second long edge surface 44 floated to excite elliptical vibrations in friction nub 48. Elliptical vibrations in an x or y-motor 31 or 32 are in the plane of the motor's piezoelectric plate 40.

Perpendicular vibrations in the friction nub may be excited by electrifying quadrant electrodes 50 along a same short edge surface 46 or 47 with a same AC voltage and floating the other quadrant electrodes. Alternatively, perpendicular vibrations may be excited by electrifying all quadrant electrodes 50 with a same voltage relative to the large electrode.

Methods for electrifying electrode configurations similar to that of motors 31 and 32 to generate perpendicular and/or parallel vibrations in friction nub 48 are described for example in the above referenced PCT Publication WO 00/74153 and U.S. Pat. No. 5,453,653. Examples of piezoelectric motors having configurations different from that shown in FIG. 1 for which perpendicular and/or parallel vibrations suitable for the practice of the present invention may be excited are also described in PCT Publication WO 00/74153 cited above and other references.

In accordance with an embodiment of the invention, to move motion plate 22, for example, in the positive y-direction, controller 52 electrifies quadrant electrodes 50 of x-motor 31 to excite perpendicular vibrations in the x-motor and clockwise (as seen from the location of controller 52) elliptic vibrations in y-motor 32. The perpendicular vibrations in x-motor 31 generate corresponding perpendicular vibrations in the motor's friction nub 48, which are represented by a double headed bold arrow 51. The clockwise elliptical vibrations in y-motor 32 generate corresponding clockwise elliptical vibrations in friction nub 48 of the y-motor, which are represented by an ellipse 53.

Perpendicular vibrations 51 in x-motor 31 substantially decouple the motor from motion plate 22, for at least a portion of each vibration cycle. Elliptical vibrations 53 in y-motor 32 transmit motion to motion plate 22 in the positive y-direction. Because x-motor 31 is substantially decoupled from motion plate 22, frictional force between the x-motor's friction nub 48 and plate 22, which opposes motion of plate 22, is substantially reduced. As a result, y-motor 32 controls motion of the plate along the y-direction with little or substantially no interference from x-motor 31.

In some embodiments of the invention, the perpendicular vibrations in x-motor 31 are synchronized with the elliptical vibrations in y-motor 32 so that they are 180° out of phase. As a result, when friction nub 48 of y-motor 32 contacts bottom surface 23 of motion plate 22, friction nub 48 of x-motor 31 does not contact plate 22 and force applied by y-motor 32 to the bottom surface operates on plate 22 as if the x-motor were not present. The out of phase operation of x and y-motors 31 and 32 substantially maximizes efficiency with which the y-motor transmits motion to plate 22. Of course, when friction nub 48 of x-motor 31 does contact bottom surface 23 of motion plate 22 the friction nub applies a relatively small frictional force to plate 22 that opposes motion of the plate. Adjusting force applied to the plate by y-motor 32 easily compensates for loss of kinetic energy by motion plate 22 due to this relatively small frictional force.

To move motion plate 22 along the x-direction, for example along the minus x-direction, the roles of x-motor 31 and y-motor 32 are reversed. X-motor 31 becomes the operative motor and controller 52 electrifies quadrant electrodes 50 of the x-motor to excite counter clockwise elliptical vibrations in the motor. Y-motor 32 becomes the non-operative motor and controller 52 electrifies quadrant electrodes 50 of the y-motor to excite perpendicular vibrations in the y-motor.

Figure 2:
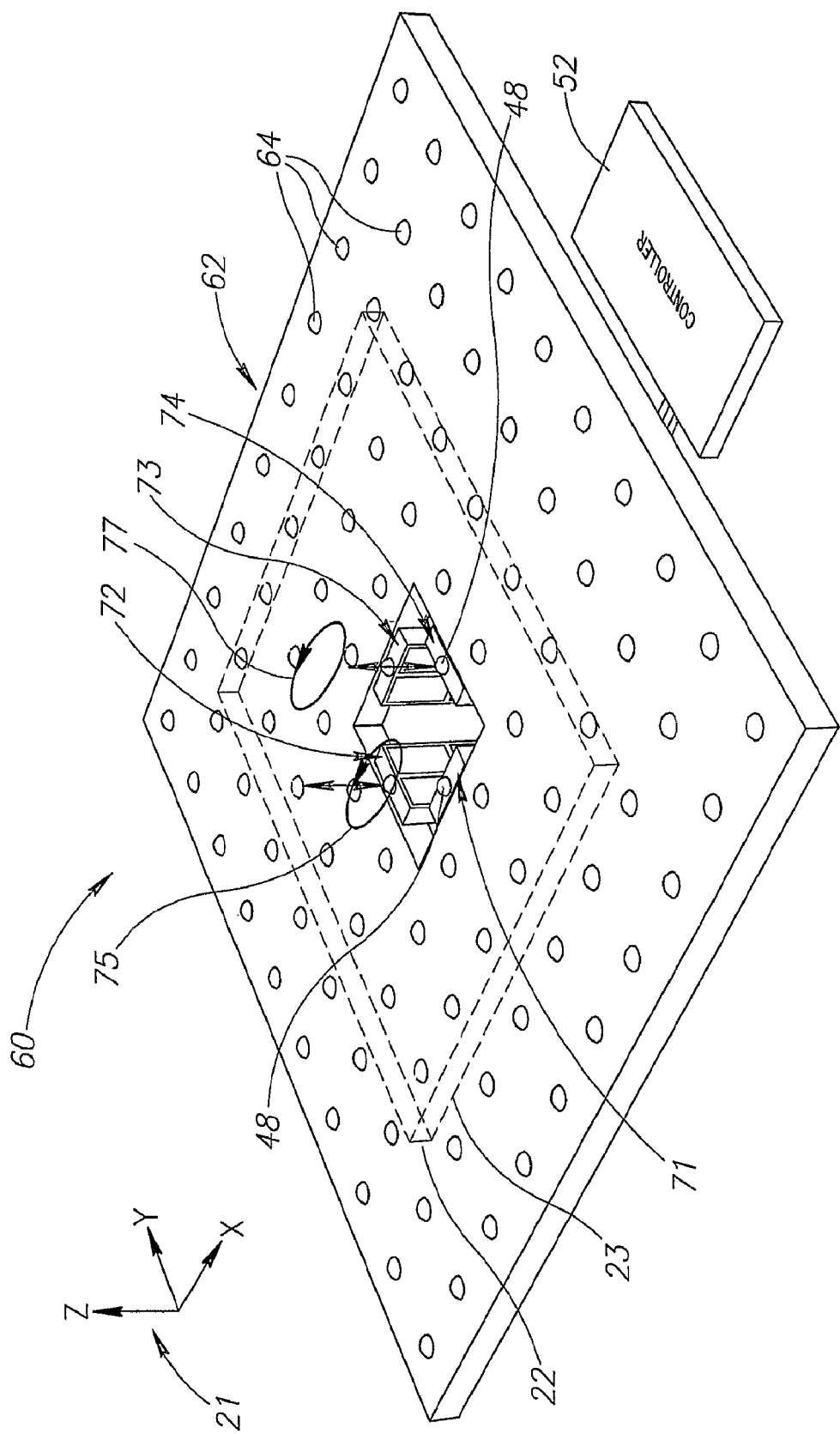
FIG. 2 schematically shows another method of coupling a plurality of piezoelectric motors to a moveable body to provide linear motion to the body along each of two selectable axes, in accordance with an embodiment of the present invention.

FIG. 2 schematically shows another configuration 60 of piezoelectric motors coupled to a moveable element in accordance with an embodiment of the present invention. By way of example the moveable element is a motion plate 22. Motion plate 22 is placed on a bearing plate 62 comprising a plurality of roller bearings 64 on which the motion plate rests. As a result of resting on bearings 64, motion plate 22 is able to move freely in any direction parallel to the surface of bearing plate 62.

By way of example, in accordance with an embodiment of the invention, four piezoelectric motors 71, 72, 73 and 74 similar in construction to motors 31 and 32 shown in FIG. 1 control motion and position of motion plate 22. The motors are optionally mounted using any of various methods known in the art on a support structure (not shown) located below bearing plate 62 so that they protrude through a hole at reference number 64 in the bearing plate and are resiliently urged to press against bottom surface 23 of motion plate 22. Motors 71 and 73 are x-motors and motors 72 and 74 are y-motors. The motors are controlled by a controller 52. Optionally, each x-motor 71 and 73 is equidistant from y-motors 72 and 74 and each y-motor is equidistant from the x-motors.

In accordance with an embodiment of the invention, motors 71, 72, 73 and 74 are controlled to move motion plate 22 selectively along the x or y-direction and/or to rotate motion plate 22. For example, to move motion plate 22 parallel to the x-axis along the negative x-direction controller 52 optionally excites y-motors 72 and 74 to execute perpendicular vibrations, schematically represented by double headed arrows 76 that decouple the y-motors from motion plate 22. Controller 52 excites x-motors 71 and 73 to optionally execute counterclockwise elliptical vibrations, schematically represented by ellipses 75 and 77 and apply force to motion plate 22 in the negative x-direction.

It is noted that for the exemplary embodiment of the invention shown in FIG. 2 and similar configurations, to move motion plate 22 parallel to the x-axis, in general, at least two piezoelectric x-motors must be excited to apply force along the x-direction. If only a single x-motor is excited to apply force to motion plate 22, unless the action line of the force intersects a line perpendicular to the motion plate that passes through the center of mass of a combined mass of the motion plate and any load mounted thereon, the force will generate a torque that rotates the motion plate. To prevent such a rotation and move plate 22 and its load parallel to the x-axis, in accordance with an embodiment of the invention, at least two piezoelectric motors are operated to apply force to the plate along the x-axis. The forces applied by the at least two motors are balanced so that a, net torque on the plate and its load is equal to zero.

To balance the forces, optionally, the position and/or acceleration of motion plate 22 is monitored using a suitable at least one position monitor and/or at least one accelerometer known in the art. Controller 52 receives input signals from the at least one position monitor and/or at least one accelerometer and determines if there is an undesired rotation in motion plate 22 and/or a net torque operating on the motion plate. The controller controls the at least two piezoelectric motors, e.g. for the exemplary case shown in FIG. 2 x-motors 71 and 73, responsive to the determined rotation and/or torque to balance the forces applied by the motors to motion plate 22 so that the motion plate moves parallel to the x-axis.

Motion parallel to the y-axis is provided by interchanging the roles of x-motors 71 and 73 and y-motors 72 and 74. Controller 52 controls x-motors 71 and 73 to execute perpendicular vibrations and y-motors 72 and 74 to execute elliptical vibrations, which are controlled so that the net torque the y-motors apply to plate 22 is substantially equal to zero. Linear motion of motion plate 22 along a line in the xy-plane that is not parallel to either the x or y-axis may be approximated by alternately controlling the x-motors and the y-motors to transmit motion to the plate.

As may be inferred from the above discussion, piezoelectric motors coupled to a moveable body in accordance with embodiments of the invention in configurations similar to that shown in FIG. 2 may be controlled to provide not only linear motion to the body but also rotary motion. For example, motion plate 22 may be controlled, in accordance with an embodiment of the invention to rotate about a contact point between the motion plate and friction nub 48 of any of piezoelectric motors 71, 72, 73 and 74.

Assume that it is desired to rotate motion plate 22 clockwise (as seen from a point on the z-axis above the motion plate) about a point at which friction nub 48 of x-motor 71 contacts the motion plate. Then controller 52 controls x-motor 71 not to vibrate so as to maintain constant contact with motion plate 22 and, optionally, x-motor 73 to execute clockwise elliptical vibrations while y-motors 72 and 74 execute perpendicular vibrations. The frictional contact between friction nub 48 of x-motor 71 prevents translation of motion plate 22 with respect to the contact point between the friction nub and the motion plate and the perpendicular vibrations of y-motors 72 and 74 decouple the y-motors from the motion plate. The elliptical vibrations of x-motor 73 apply a force that generates a torque, which rotates the motion plate about the contact point.

It is of course possible to rotate motion plate 22 about the contact point by controlling x-motor 73 and one of y-motors 72 and 74 to execute perpendicular vibrations. The other of y-motors 72 and 74 is controlled to execute clockwise elliptical vibrations to generate a torque that rotates motion plate 22 clockwise. However, rotating motion plate 22 about the point of contact between friction nub 48 of piezoelectric motor 71 and the plate using a y-motor to generate torque is, for the configuration shown in FIG. 2, generally less efficient than using x-motor 72 to generate the torque. For a given force, a y-motor 72 or 74 acts on a shorter moment arm than does x-motor 73.

It is also possible, in accordance with an embodiment of the invention, to control motors 71, 72, 73 and 74 to rotate motion plate 22 about points other than a point of contact between a friction nub 48 of one of the motors and the plate. For example, motion plate 22 can be rotated about substantially any point along a line that extends through the points of contact of the motion plate and frictions nubs 48 of x-motors 71 and 73 by controlling the x-motors to apply appropriate force to bottom surface 22 of the motion plate.

Figure 3:
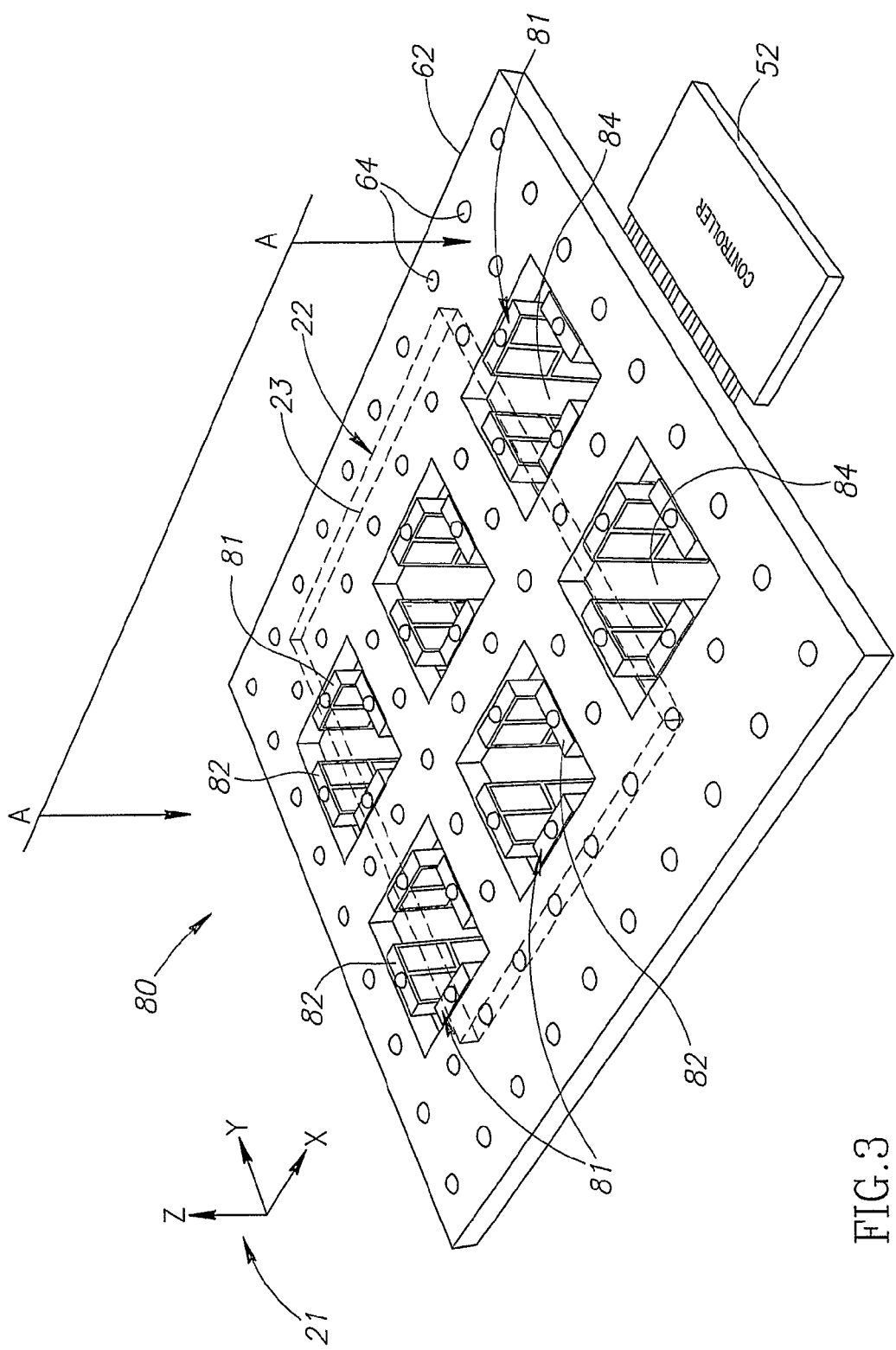
FIG. 3 schematically shows a method of coupling a plurality of piezoelectric motors to a moveable body in which not all of the plurality of motors are coupled to the body at all times, in accordance with an embodiment of the present invention.

FIG. 3 schematically shows another configuration 80 for coupling a plurality of piezoelectric motors to motion plate 22, in accordance with another embodiment of the present invention.

Similarly to configuration 60 shown in FIG. 2, in configuration 80 motion plate 22 is mounted to a bearing plate 62 having roller bearings 64 on Which the motion plate 22 rests. However, unlike configuration 80 in FIG. 3 in which four piezoelectric motors 71, 72, 73 and 74 are used to control motion of motion plate 22, in configuration 80 a plurality of piezoelectric motors greater than four is used to control motion of the motion plate. For a given size motion plate 22, the plurality of motors shown in FIG. 3 provides a position range for the motion plate that is greater than that of configuration 80.

The plurality of motors comprises a plurality of x-motors 81 and a plurality of y-motors 82. The motors are arranged so that for substantially any location of motion plate 22 on bearing plate 62 at least two x-motors 81 and at least two y-motors 82 contact bottom surface 23 of the motion plate and can be controlled to transmit motion to the motion plate. Optionally, x-motors 81 and y-motors 82 are grouped in groups of four so that each group comprises two x-motors and two y-motors. The x and y-motors in a same group of four protrude through a same hole 84 in bearing plate 62. Optionally the motors in a same group of four are positioned relative to each other similarly to the manner in which x-motors 71 and 73 and y-motors 72 and 74 are positioned in configuration 60 shown in FIG. 2.

To move motion plate 22, x-motors 81 and y-motors 82 are controlled by controller 52 similarly to the way in which x and y-motors 71, 72, 73 and 74 shown in FIG. 2 are controlled to move motion plate 22. However, in accordance with an embodiment of the invention, x-motors 81 and y-motors 82 are controllable to move motion plate 22 over an x-distance range and a y-distance range substantially greater than that provided by configuration 80 shown in FIG. 2. X-motors 81 are controllable to "pass" motion plate 22 from one pair of x-motors 81 to a next pair of x-motors in order to move the motion plate over an x-distance greater than a distance that a single pair of x-motors 81 can move the plate. Similarly, y-motors 82 are controllable to pass motion plate 22 from one pair of y-motors to a next pair of y-motors in order to move the motion plate over a y-distance greater than a distance that a single pair of y-motors 82 can move the plate.

For example, consider a first pair of x-motors 81 that is not a pair of x-motors located farthest from the origin of coordinate system 21 in the positive x-direction. Before the first pair of x-motors 81 moves motion plate 22 along the positive x-direction to a position beyond which the pair can no longer move the plate in the positive x-direction, plate 22 becomes positioned over a second pair of x-motors 81. The second pair of x or y-motors 81 or 82 is controllable to continue moving the plate in the positive x-direction.

In accordance with an embodiment of the invention, to facilitate smooth transfer of motion plate 22 from a first pair of x or y-motors 81 or 82 to a second pair of x or y-motors 81 or 82, bottom surface 23 of motion plate 22 is beveled along its edges. In addition, motion of an elastic element that urges a piezoelectric x or y motor 81 or 82 towards bottom surface 23 is limited so that when the motor is not beneath motion plate 22, its friction nub 48 does not protrude above the beveled edge of bottom surface 23. As a result, as motion plate 22 approaches and moves over an x or y-piezoelectric motor, friction nub 48 of the motor gradually and smoothly comes into contact with the bottom surface.

FIGS. 4A-4D show schematic section views in a plane indicated by line AA of the configuration shown in FIG. 3 (In the figures, for convenience of presentation, bearing plate 62 is not shown). The section views illustrate motion plate 22 moving from a position at which a first pair of x-motors 81 moves the plate in the x-direction to a position at which a second pair of x-motors 81 moves the plate in the x-direction, in accordance with an embodiment of the invention. A block arrow 90 indicates direction of motion of plate 22. Only features germane to the discussion are shown in FIGS. 4A-4D. Bearing plate 62 shown in FIG. 3 is not shown in FIGS. 4A-4D and only one x-piezoelectric motor 91 of the first pair of x-motors 81 and one x-piezoelectric motor 92 of the second pair of x-motors 81 are shown in the figures. Bottom surface 23 is beveled along edges 100 of the bottom surface so that the bottom surface comprises a relatively large horizontal surface 102 parallel to the x-y plane of coordinate system 21 (FIG. 3) and beveled surfaces 104 along edges 100. The x and z-axes of coordinate system 21 show in FIG. 3 are shown in FIGS. 4A-4D for convenience of spatial referencing.

Each motor 91 and 92 is mounted to a suitable support structure 106 having an elastic element 111 and 112 respectively that urges the motor upwards in the positive z-direction towards bottom surface 23 of motion plate 22. Extension of elastic elements 111 and 112 is limited in the z-direction, using methods and devices known in the art, so that if a motor 91 or 92 is not beneath motion plate 22, friction nub 48 of the motor does not protrude above (in the z-direction) edges 100 of the motion plate.

Figure 4A:
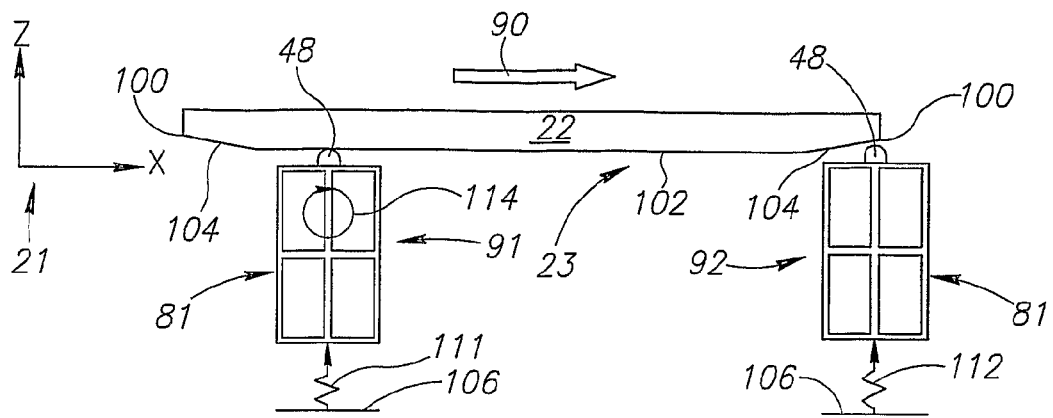
FIGS. 4A-4D show section views of the body and motors shown in FIG. 3 and illustrate how the particular motors of the plurality of motors that are coupled to the body change as the body is moved, in accordance with an embodiment of the present invention.

In FIG. 4A, x-motor 91 is located beneath motion plate 22. and its friction nub 48 is resiliently pressed to horizontal surface 102 by elastic element 111. The friction nub is executing clockwise elliptic vibrations represented by ellipse 114 to move motion plate 22 in the x-direction towards x-motor 92. X-motor 92 is located just beneath an edge 100 of motion plate 22, but because motion of elastic element 112 is limited in the positive z-direction, friction nub 48 of the motor does not protrude beyond the edge. Preferably, as shown in FIG. 4A, when elastic element 112 is at the limit of its extension, friction nub 48 is located at a z-coordinate slightly below that of edge 100.

Figure 4B:
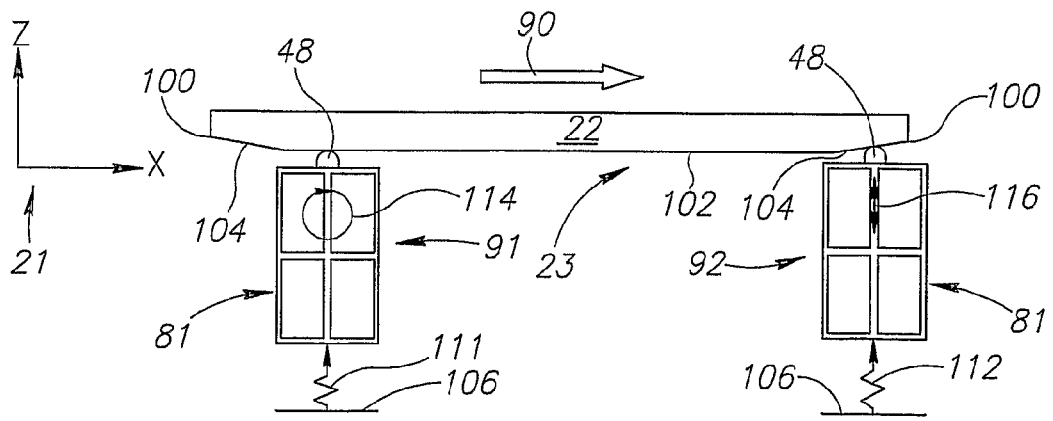

In FIG. 4B, x-motor 91 has moved motion plate 22 towards x-motor 92 to a position at which friction nub 48 of motor 92 first touches bevel surface 104. Before x-motor 92 touches bevel 104, or just as it touches the bevel, controller 52 (FIG. 3) optionally controls x-motor 92 to execute perpendicular vibrations represented by double headed arrow 116 to reduce friction between the friction nub and the surface of the bevel.

Figure 4C:
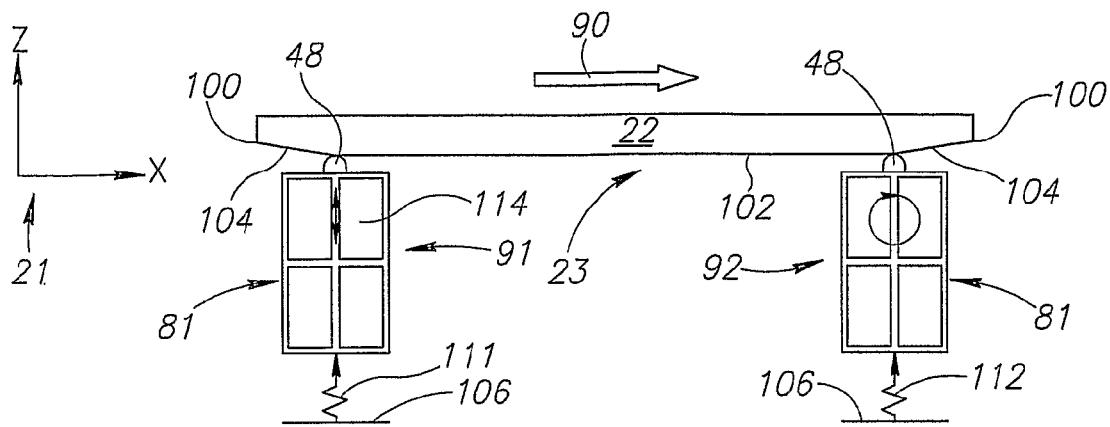

In FIG. 4C x-motor 91 has moved motion plate 22 to a position at which friction nubs 48 of both x-motor 91 and x-motor 92 contact horizontal surface 102 of the motion plate. Controller 52 has "transferred" control of motion of motion plate 22 from x-motor 91 to x-motor 92. The controller is controlling x-motor 92 to execute clockwise elliptic motion 118 to continue moving the motion plate in the x-direction and controlling x-motor 91 to execute perpendicular vibrations 120 to reduce friction between the motor's friction nub 48 and horizontal surface 102.

Figure 4D:
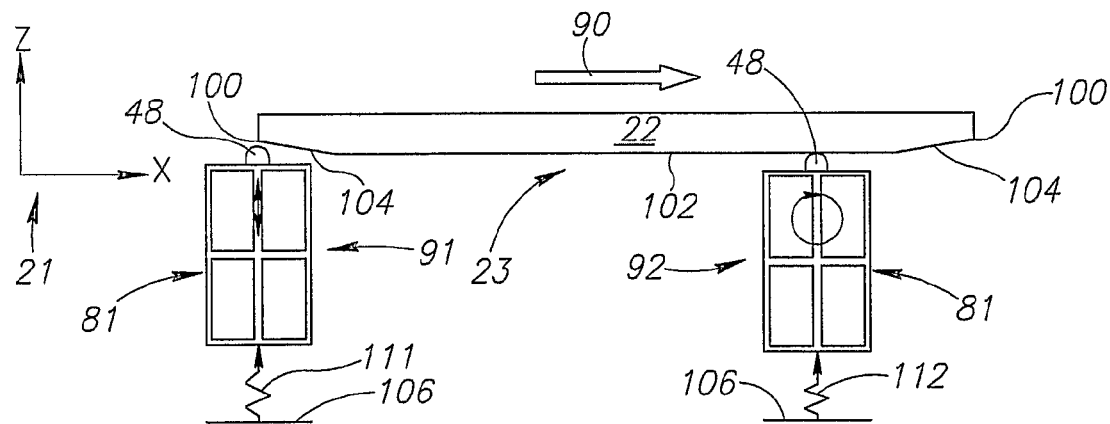

In FIG. 4D motion plate 22 has been moved in the x-direction by x-motor 92 so that x-motor 91 no longer contacts the motion plate. Elastic element 106 is extended to its maximum length and friction nub 48 is located at a z-coordinate greater than that of horizontal surface 102 but less than that of edges 100 of motion plate 22.

Whereas in the above description of exemplary embodiments of the invention a body moved by a plurality piezoelectric motors is a planar body, practice of the invention is not limited to moving planar bodies. A body coupled to a plurality of piezoelectric motors in accordance with an embodiment of the invention may, for example, be cylindrical or circular.

Figure 5:
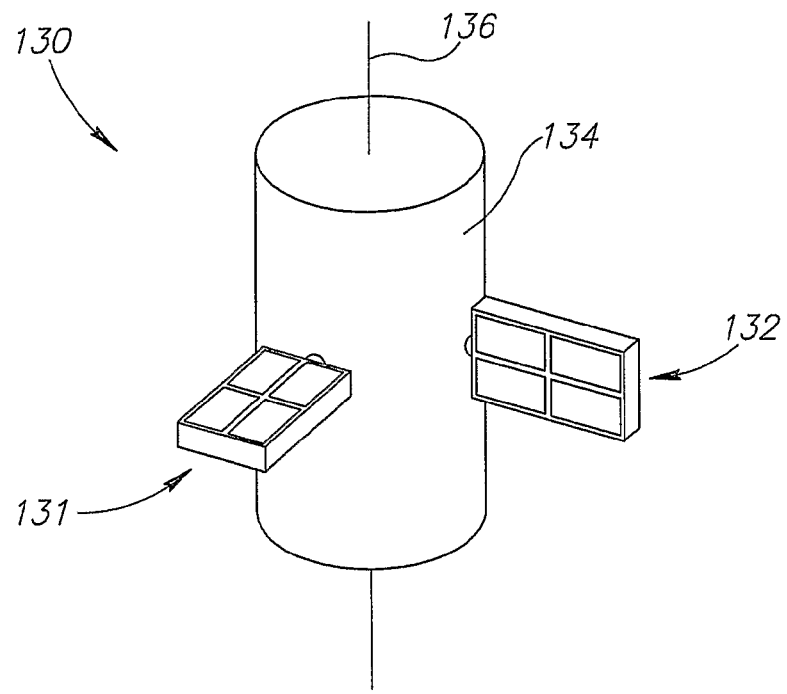
FIG. 5 schematically shows a plurality of piezoelectric motors coupled to a cylindrical body, in accordance with an embodiment of the present invention.

FIG. 5 schematically shows a configuration 130 optionally comprising two piezoelectric motors 131 and 132 coupled to a cylindrical body 134, in accordance with an embodiment of the present invention. When motor 131 is operative and motor 132 is non-operative motor 131 rotates cylinder 134 about its axis 136. On the other hand when motor 131 is non-operative and motor 132 is operative, motor 132 translates cylinder 134 along axis 136.

Figure 6:
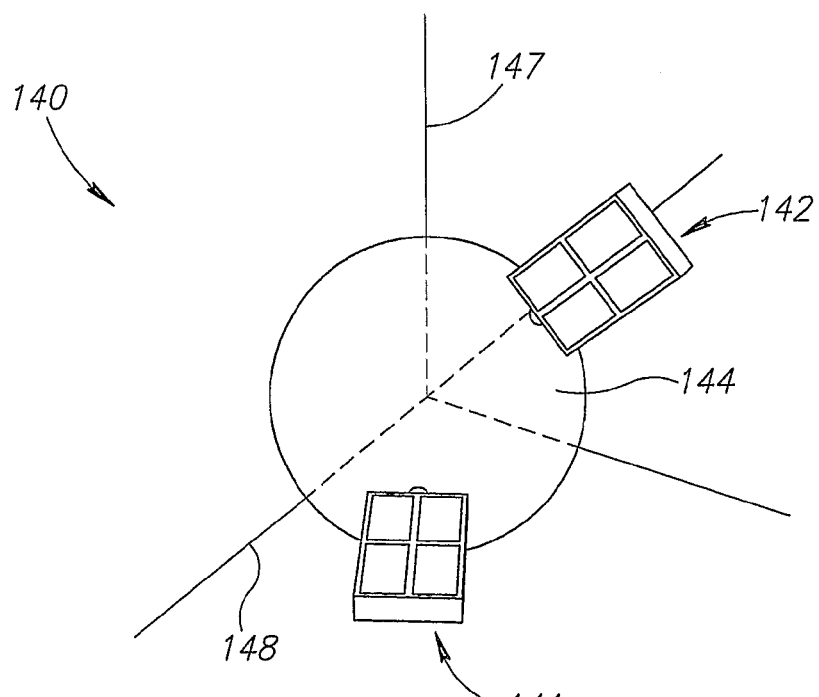
FIG. 6 schematically shows a plurality of motors coupled to a spherical body, in accordance with an embodiment of the present invention.

FIG. 6 schematically shows a configuration 140 optionally comprising piezoelectric motors 141 and 142 coupled to a spherical body 144, in accordance with an embodiment of the present invention. When motor 141 is operative and motor 142 is non-operative motor 141 rotates sphere 144 about an axis 147. On the other hand when motor 142 is operative and motor 141 is non-operative motor 142 rotates the sphere about an axis 148.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

The invention claimed is:

1. A method of moving a body comprising:
    coupling a plurality of piezoelectric motors to the body by pressing a coupling region of each of the motors to a surface of the body;
    controlling at least one of the motors to apply a force parallel to the surface to move the body; and
    simultaneously controlling at least one of the motors so that its coupling region executes only vibrations that are substantially perpendicular to the surface.

2. A method according to claim 1 wherein controlling a motor to apply a force parallel to the surface comprises controlling the motor so that the coupling region of the motor vibrates with a component of vibration parallel to the surface.

3. A method according to claim 2 and comprising controlling the motor so that the coupling region simultaneously vibrates with a component of vibration perpendicular to the surface of the body.

4. A method according to claim 1 wherein each motor comprises electrodes that are electrified to control its operation.

5. A method according to claim 4 wherein controlling the motor to apply a force parallel to the surface comprises electrifying at least one of the electrodes with a pulsed voltage.

6. A method according to claim 4 wherein controlling the motor to apply a force parallel to the surface comprises electrifying at least one of the electrodes with a DC voltage.

7. A method according to claim 1 and comprising mounting the moveable body to a support structure that constrains it to be selectably moveable along either of a first direction and a second direction.

8. A method according to claim 7 wherein coupling the plurality of motors comprises coupling at least some of the motors so that they are controllable to apply force to the surface along the first direction and some of the motors so that they are controllable to apply force to the body along the second direction.

9. A method according to claim 1 and comprising mounting the body to a support structure that enables the body to be freely moved along any direction parallel to a same plane.

10. A method according to claim 9 wherein coupling the plurality of motors comprises coupling a first pair of motors controllable to apply force to the surface along a first direction parallel to the plane and a second pair of motors controllable to apply force to the surface along a second direction parallel to the plane.

11. A method according to claim 10 and comprising controlling the first or second pair of motors to apply forces to the surface that move the body in the first or second direction respectively and controlling the motors so that a net torque resulting from the forces is substantially equal to zero.

12. A method according to claim 11 and comprising controlling a first one of the motors so that its contact region is in constant contact with a particular region of the surface of the body so that the at least one motor that applies a force parallel to the surface generates a torque that rotates the body about the particular region.

13. A method according to claim 7 and comprising controlling the motors in a pair of motors to generate a torque that rotates the body about a point along a line that passes through the contact regions of the two motors.

14. A method according to claim 1 wherein at a first position of the body the plurality of motors comprises at least one motor not comprised in the plurality of motors at a second position of the body.

15. A method according to claim 14 and comprising controlling at the first position at least one motor not comprised in the plurality of motors at the second position to apply a force parallel to the surface.

16. Apparatus for moving a body having a surface comprising:
a plurality of piezoelectric motors; and
a controller that controls at least one of the motors to apply a force parallel to the surface to move the body and simultaneously controls at least one of the motors to execute only vibrations that are substantially perpendicular to the surface.

17. Apparatus according to claim 16 wherein the surface of the body is planar.

18. Apparatus according to claim 17 and comprising:
a first support structure coupled to the body that enables the body to move freely only along a first direction parallel to the planar surface; and
a second support structure coupled to the first structure that allows the first structure to move freely only along a second direction parallel to the planar surface;
wherein at least one of the motors is controllable to apply a force parallel to the surface along the first direction and at least one of the motors is controllable to apply a force parallel to the surface along the second direction.

19. Apparatus according to claim 16 wherein said surface is flat, and comprising a plurality of bearings on which the flat surface lies that enables the surface to move freely in any direction parallel to the surface.

20. Apparatus according to claim 19 wherein the plurality of motors comprises at least one set of four motors comprising a first pair of motor controllable to apply force to the surface along a first direction and a second pair of motors controllable to apply force to the surface along a second direction.

21. Apparatus according to claim 20 wherein to move the body along the first or second direction the controller controls the first or second pair of motors respectively so that a net torque resulting from the forces the motors apply to the surface is substantially equal to zero.

22. Apparatus according to claim 21 wherein the controller controls at least one motor so that its contact region constantly contacts a particular region of the surface and wherein the force applied by the at least one motor parallel to the surface rotates the surface about the particular region.

23. Apparatus according to claim 20 wherein the controller controls the first pair of motors or the second pair of motors to generate a torque that tends to rotate the surface about a point along a line that passes through the coupling regions of the motors.

24. Apparatus according to claim 16 wherein the surface is a circularly cylindrical surface having an axis of rotation.

25. Apparatus according to claim 24 wherein at least one motor is controllable to apply a force parallel to the surface that tends to rotate the cylindrical surface about its axis of rotation and at least one motor is controllable to apply a force parallel to the surface that tends to translate the surface along its axis of rotation.

26. Apparatus according to claim 25 wherein the surface is a spherical surface having a center.

27. Apparatus according to claim 26 wherein at least one motor is controllable to apply a force parallel to the surface that tends to rotate the surface about a first axis that passes through the center and at least one motor is controllable to apply a force parallel to the surface that tends to rotate the surface about a second axis that passes through the center.

28. Apparatus according to claim 16 wherein at a first position of the body the plurality of motors comprises at least one motor not comprised in the plurality of motors at a second position of the body.

29. Apparatus according to claim 28 wherein at the first position the controller controls at least one motor not comprised in the plurality of motors at the second position to apply a force parallel to the surface.

* * * * *